United States Patent
Pawlowski

(10) Patent No.: US 7,225,312 B2
(45) Date of Patent: *May 29, 2007

(54) MULTI-BANK MEMORY ACCESSES USING POSTED WRITES

(75) Inventor: J. Thomas Pawlowski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/179,784

(22) Filed: Jul. 12, 2005

(65) Prior Publication Data

US 2006/0028851 A1   Feb. 9, 2006

Related U.S. Application Data

(63) Continuation of application No. 10/232,430, filed on Aug. 28, 2002, now Pat. No. 6,938,142.

(51) Int. Cl.
 *G06F 12/00* (2006.01)
(52) U.S. Cl. .................. 711/167; 711/168; 711/169; 365/233; 365/230.04
(58) Field of Classification Search .................. None
 See application file for complete search history.

(56) References Cited

U.S. PATENT DOCUMENTS

| 4,823,302 | A | 4/1989 | Christopher |
|---|---|---|---|
| 5,060,145 | A | 10/1991 | Scheuneman et al. |
| 5,426,771 | A | 6/1995 | Asprey et al. |
| 5,440,717 | A | 8/1995 | Bosshart |
| 5,473,574 | A | 12/1995 | Clemen et al. |
| 5,519,847 | A | 5/1996 | Fandrich et al. |
| 5,752,270 | A | 5/1998 | Wada |
| 5,809,228 | A | 9/1998 | Langendorf et al. |
| 5,903,916 | A | 5/1999 | Pawlowski et al. |
| 6,075,730 | A | 6/2000 | Barth et al. |
| 6,215,724 | B1 | 4/2001 | Pawlowski |
| 6,249,480 | B1 | 6/2001 | Mick |
| 6,381,684 | B1 * | 4/2002 | Hronik et al. ............... 711/167 |
| 6,549,994 | B1 * | 4/2003 | Noh ........................... 711/169 |
| 6,557,084 | B2 | 4/2003 | Freerksen et al. |
| 6,567,338 | B1 | 5/2003 | Mick |
| 6,587,936 | B1 | 7/2003 | Rivers et al. |
| 6,938,142 | B2 | 8/2005 | Pawlowski |

* cited by examiner

*Primary Examiner*—Reginald Bragdon
*Assistant Examiner*—Ngoc Dinh
(74) *Attorney, Agent, or Firm*—Fish & Neave IP Group Ropes & Gray LLP

(57) ABSTRACT

Systems and methods for reducing delays between successive write and read accesses in multi-bank memory devices are provided. Computer circuits modify the relative timing between addresses and data of write accesses, reducing delays between successive write and read accesses. Memory devices that interface with these computer circuits use posted write accesses to effectively return the modified relative timing to its original timing before processing the write access.

17 Claims, 6 Drawing Sheets

MULTI-BANK MEMORY ACCESSES USING POSTED WRITES

CROSS REFERENCE TO RELATED APPLICATION

This is a continuation of commonly-assigned U.S. patent application Ser. No. 10/232,430, filed Aug. 28, 2002, now U.S. Pat. No. 6,938,142.

BACKGROUND OF THE INVENTION

This invention relates to read and write memory accesses in multi-bank memory devices. In particular, this invention relates to reducing the number of clock cycles incurred when accessing multi-bank memory devices.

Computers and other electronic systems usually include memory subsystems. Typical memory subsystems include a memory controller that controls communications between the CPU and various memory devices. Memory devices, such as, for example, DRAMs (dynamic random access memories), are widely used in computer circuits because of their large storage capacity and relatively low power requirements. A DRAM can contain several internal banks of memory cells, which are organized into rows and columns. Typically, a non-banked memory device is one in which the memory device has one memory array with one set of row-column decoding circuitry and one set of data sensing circuitry, while a multi-banked memory device has at least two separate memory arrays, each operated independently with separate row-column decoding circuitry and data sensing circuitry. One advantage of multi-banked memory devices is increased parallelization of internal operations, which increases memory device throughput.

Any memory cell in a particular row of a particular bank of a multi-banked memory device can be accessed after that bank and row are "activated". Activated banks or rows stay activated for a given period of time, after which they are de-activated and then re-activated for further accesses.

During read accesses to a DRAM, there is at least a one clock cycle delay from the time a valid read address is provided to the DRAM to the moment data corresponding to that read address appears at the outputs of the DRAM (assuming that the bank and row accessed by that read address have already been activated). However, the relative timing of addresses and data for write accesses to a DRAM is different from that of addresses and data for read accesses. During write accesses to a DRAM, a write address is typically provided to the DRAM at substantially the same time as data to be written to that write address. When a write access follows a read access and vice-versa, at least a one clock cycle delay results from this difference in read and write accesses. This one clock cycle delay multiplied by the vast number of read and write accesses typically performed by computers and other systems with such memory can significantly reduce the overall speed/bandwidth performance of those computers and systems.

In view of the foregoing, it would be desirable to reduce read-write access delay and write-read access delay in multi-bank memory devices.

SUMMARY OF THE INVENTION

It is an object of this invention to reduce read-write access delay and write-read access delay in multi-bank memory devices.

In accordance with the invention, computer circuits that interface with memory devices are provided that have reduced memory access delays. These reduced delays are accomplished by increasing the relative timing between addresses and data for write accesses. This increased relative timing is similar in magnitude to the delay between addresses and data for read accesses. With this adjustment to the relative timing between write addresses and data, read accesses and write accesses can be performed successively with reduced idle time between them.

Advantageously, memory devices are not modified to accommodate the adjusted relative timing with respect to the storage circuits that form the memory storage areas or memory cells of the memory devices. Instead, pipeline registers are provided to re-adjust the relative timing between the write addresses and write data back to the original timing or, optionally, to other relative timings acceptable to the storage circuits. In effect, the pipeline registers contain posted write accesses. Moreover, incoming read accesses are monitored by the memory devices for matches with the pending write accesses. When a match occurs, data is provided from the appropriate pipeline registers instead of the storage circuits.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Memory devices and computer circuits that interface with each other are typically constructed such that addresses and data for write accesses are coincident with each other. For example, with a memory device that has separate address and data busses, computer circuits are typically configured to present addresses and data for a write access during the same clock cycle, or at the same clock edge. Alternatively, data is presented at some other time convenient for the memory device (e.g., data is presented while the memory device is decoding the column address and is inserted into the memory array at a convenient point during the decoding process). Within the memory device itself, addresses and data for write accesses typically retain the same relative timing (i.e., the addresses and data for a write access are present during the same clock cycle or clock edge).

However, addresses and data for read accesses to memory devices are not coincident during the same clock cycle or clock edge because the data is read from the memory devices after receiving a read address, thus creating a delay between the address and data for any is given read access. This delay is typically one or more clock cycles or clock edges because data provided by a memory device during a read access is usually registered or latched within the memory device. Thus, the relative timing between addresses and data for read accesses is usually different than that for addresses and data for write accesses. Computer circuits interfacing with memory devices exhibiting this difference in relative timing can experience delay ("bus turnaround delay") between a write access and a read access and vice-versa.

Figure 1:
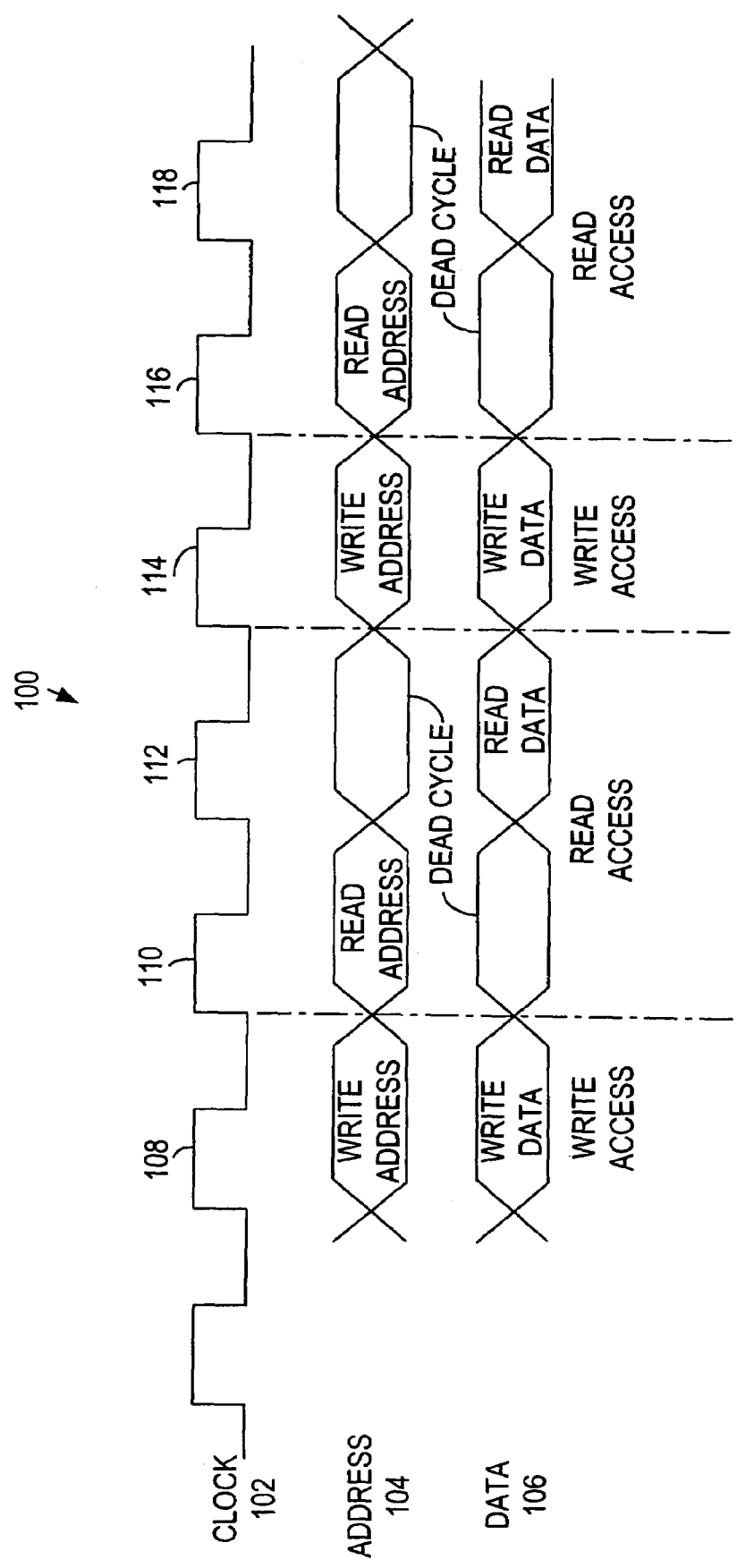
FIG. 1 is a timing diagram of known write-read accesses.

Timing diagram 100 of FIG. 1 illustrates typical bus turnaround delay that occurs between read and write access cycles (or vice-versa) in a multi-bank memory device, such as an SDRAM (synchronous DRAM). Often, practical considerations require more than the one dead cycle shown in FIG. 1. This bus turnaround delay is also experienced by most single banked devices such as SRAM (static random access memory). The states of the address bus and the data bus coupled to a memory device are represented by address bus timing 104 and data bus timing 106, respectively. The data bus and address bus may be synchronized to one another, as well as to other input and output signals of the memory device, with a clock signal represented by clock timing 102.

For a write access from a memory controller to an address within the memory device, the address and data are typically presented by the memory controller at the same clock edge and are valid for a clock cycle. A typical write access is illustrated in FIG. 1. As shown, both the write address and the write data for a write access are valid for clock cycle 108. If the write access at clock cycle 108 is followed by a read access to a second address ("read address") within the memory device, the second address may be presented at clock cycle 110, which immediately follows clock cycle 108. If both read and write accesses presented during clock cycles 110 and 108 respectively fall within the same bank (and row) such that bank and row activation does not necessitate the use of extra clock cycles and thus, does not add to bus turnaround delay, data corresponding to the read access ("read data") may be presented as early as clock cycle 112. The read data cannot be presented for the full period of clock cycle 110 because some finite amount of time is required to access the portion of memory addressed by the read address. Typically, the read data is held valid for at least one clock cycle to ensure that it is received by the memory controller (and any other coupled devices). Thus, the data bus is idle at clock cycle 110, resulting in a "dead cycle", and the read data is presented during clock cycle 112.

If memory accesses by the memory controller require totally non-sequential addresses (i.e., accesses from different rows and columns), then each access requires row and column decoding and activation in succession. In addition, if the row and column accesses include large numbers of alternating read and write accesses (e.g., read access followed by write access followed by read access), then a large number of additional clock cycles will be wasted because of the amount of time required to perform the read access and then turn the bus around to perform the write access. The invention provides dramatic improvement in this case.

If the read access is followed by a write access, the write address corresponding to that write access cannot be presented by the memory controller at clock cycle 112 because the data to be written into memory could collide with the data corresponding to the read access. Therefore, the memory controller is likely to start the write access at clock cycle 114 by presenting the write address in that clock cycle. As a result, the address bus is idle at clock cycle 112, resulting in another "dead cycle".

Thus, the address bus and data bus are idle for one clock cycle while the memory device switches from one access mode (e.g., a write access) to another access mode (e.g., a read access) and back to the first access mode (e.g., a write access). In some systems, the CPU may alternate between read and write accesses frequently, thus resulting in underutilization of the address bus and data bus as illustrated in FIG. 1. In particular, a sequence of four accesses (write-read-write-read) as shown in FIG. 1 requires 6 cycles (clock cycles 108, 110, 112, 114, 116, and 118). For any sequence of alternating read-write memory accesses, the proportion of dead cycles to the total number of cycles needed to complete the sequence can vary from a 1:3 ratio to a 1:4 ratio.

Figure 2:
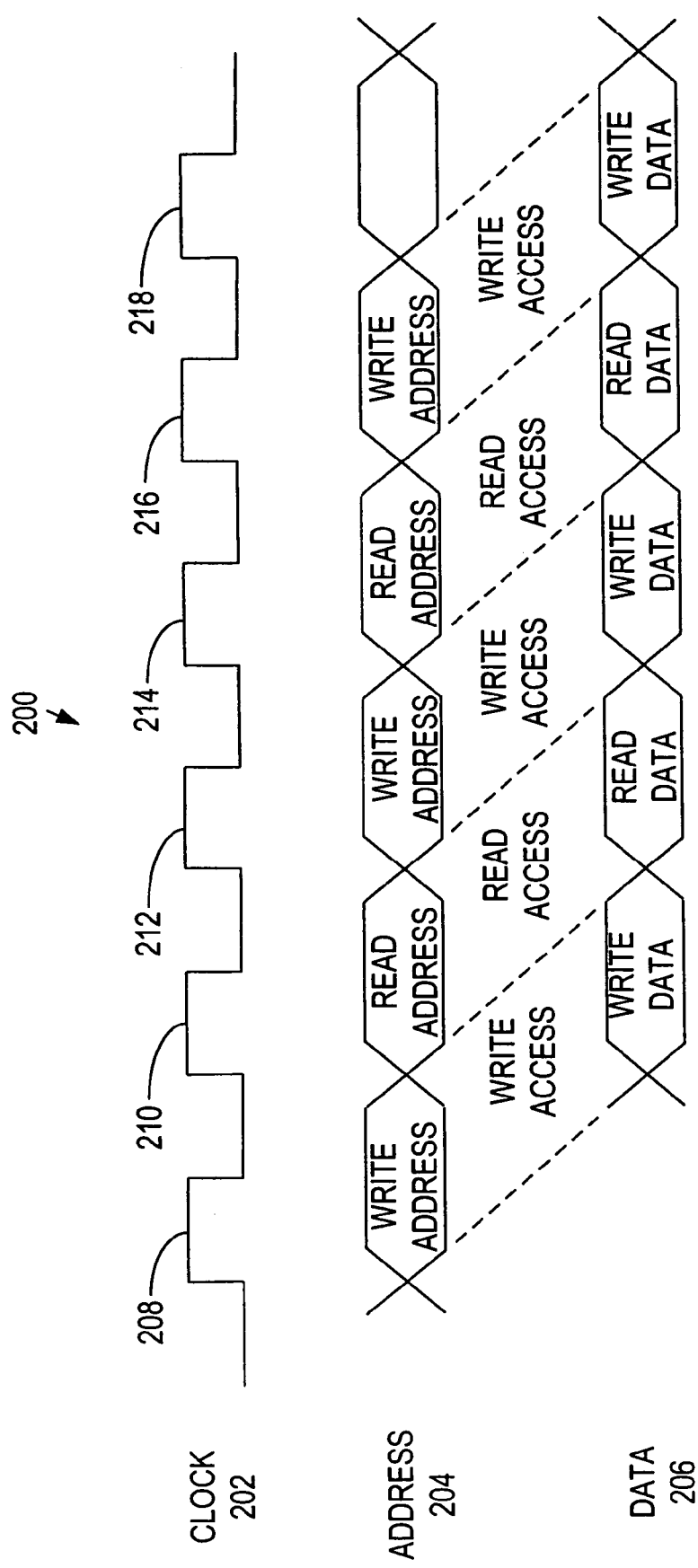
FIG. 2 is a timing diagram of write-read accesses in memory devices and computer circuits according to the invention.

According to the invention, the timing of the write data with respect to the write address is advantageously modified from that shown in FIG. 1 to reduce the number of dead cycles. FIG. 2 illustrates the advantageous effect of an added delay in the timing of write data with respect to its write address—a reduction, if not elimination, of dead cycles. As shown, the write data corresponding to the write address at clock cycle 208 is intentionally delayed by a clock cycle such that the write data is presented by the memory controller at clock cycle 210. If the write access starting at clock cycle 208 is immediately followed by a read access, none of the timing aspects of the read access need be changed in accordance with the invention. If the read access is immediately followed by a write access, that write access can start at clock cycle 212, which immediately follows clock cycle 210, because the corresponding write data presented at clock cycle 214 does not cause data bus contention with the read data presented at clock cycle 216. A memory device that exhibits the delayed timing of write data with respect to its write address as illustrated in FIG. 2 can operate its address bus and data bus at very high efficiency, particularly for an arbitrarily lengthy sequence of alternating read-write accesses.

In accordance with the invention, memory devices can process read and write accesses having the timings shown in FIG. 2 without modifying write access timing requirements of internal storage areas of the memory devices. This is done by pipelining the addresses and data for write accesses to restore the original relative timing between the write addresses and data before the addresses and data are presented to the internal storage areas. These pipeline registers delay the actual processing of write accesses at the internal storage areas of the memory devices. In effect, the registers used to pipeline the addresses and data contain "pending" or "posted" write accesses.

In accordance with the invention, read accesses from the same memory locations for which there are pending write accesses are provided with data from the pipeline registers instead of from those memory locations. The addresses for the pending write accesses contained in the registers are compared with addresses for incoming read accesses. If an address stored in the pipeline registers matches the address for an incoming read access, data for that read access is provided from a pipeline register.

Multi-bank and row-column access memory devices preferably include pipeline registers. They also include banks of memory cells that are addressed by row and column addresses and bank select signals. During a typical read or write access to a memory location in an SDRAM, for example, an external address bus to the SDRAM carries the row addresses and column addresses in a multiplexed fashion. The row addresses and column addresses can be latched by two sets of pipeline registers in which one set of registers latches the row addresses and the other set latches the column addresses. The resulting pipelined row and column addresses are provided to row and column address decoders, pairs of which are typically provided for each bank of memory cells. Data for write accesses are pipelined by another set of registers that are connected to the banks of memory cells.

If bank select signals are also required for selection of banks, these bank select signals are also pipelined in the same manner as row and column addresses. In addition, to provide read accesses to the same locations as pending write accesses (that are stored in the pipeline registers), row and column addresses for incoming read accesses are compared with those stored in the pipeline registers. When there is a match between row and column addresses for an incoming read access and those stored in a set of row and column pipeline registers, the data for that read access is provided by data in a pipeline register, rather than by the memory cells. The row and column pipeline registers, data pipeline registers, bank select line pipeline registers, and all other circuitry associated with selectively pipelining addresses and data for write accesses are preferably controlled by command decoder circuitry and other circuits typically used in multi-bank and row-column access devices. These controls detect when write accesses are occurring and control the data provided to read accesses according to the invention.

Figure 3:
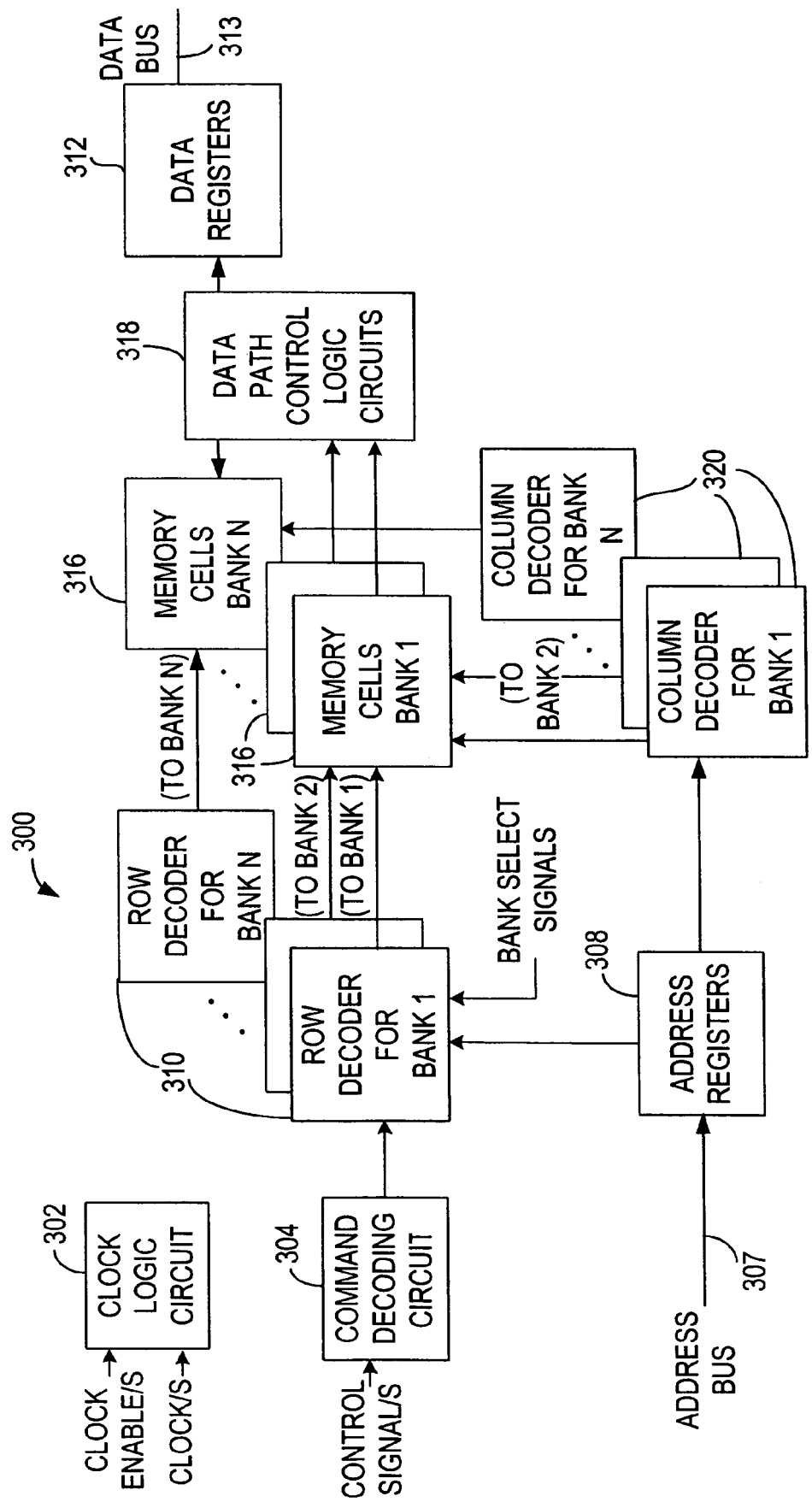
FIG. 3 is a block diagram of a memory device according to the invention.

FIG. 3 shows a multi-bank, row-column accessed memory in accordance with the invention. Memory 300 includes clock logic circuit 302 and command decoding circuit 304. Circuits 302 and 304 generate control logic and clocks for other areas of memory 300. The address bus for memory 300 is configurable as either multiplexed or not multiplexed. When the address bus is not multiplexed, row and column addresses are simultaneously presented to the device and latched. When multiplexed, address information is presented to the memory device on two consecutive cycles. For example, the first half of the address information can be latched on the first cycle, and the second half of the address information can be latched on the second cycle. This division of the address into two halves is not necessarily a row-column division. The memory device ultimately designates one portion of the address information as a row address and another portion of the address information as a column address. In one embodiment, address registers 308 are coupled to address bus 307 to capture row and column addresses of write accesses to memory 300. To control the latching of row and column addresses during write accesses, command decoding circuit 304 is coupled to address registers 308. Address registers 308 are also coupled to row decoder circuits 310 and column decoder circuits 320. Row decoder circuits 310 are coupled to banks of memory cells 316 via bank select signal lines, and can access a row from a specific bank in accordance with bank select signals.

Each bank of memory cells 316 is coupled to data path control logic circuits 318 such that specific columns from a row may be read from, or written to, under the control of signals from command decoding circuit 304 and column decoding circuits 320. Data path control logic circuits 318 control data written into the columns of data such that the appropriate data is written into memory cells 316. Data path control logic circuits 318 also control data read from the columns of banks of memory cells 316 into data registers 312, which are then output onto data bus 313.

Figure 4:
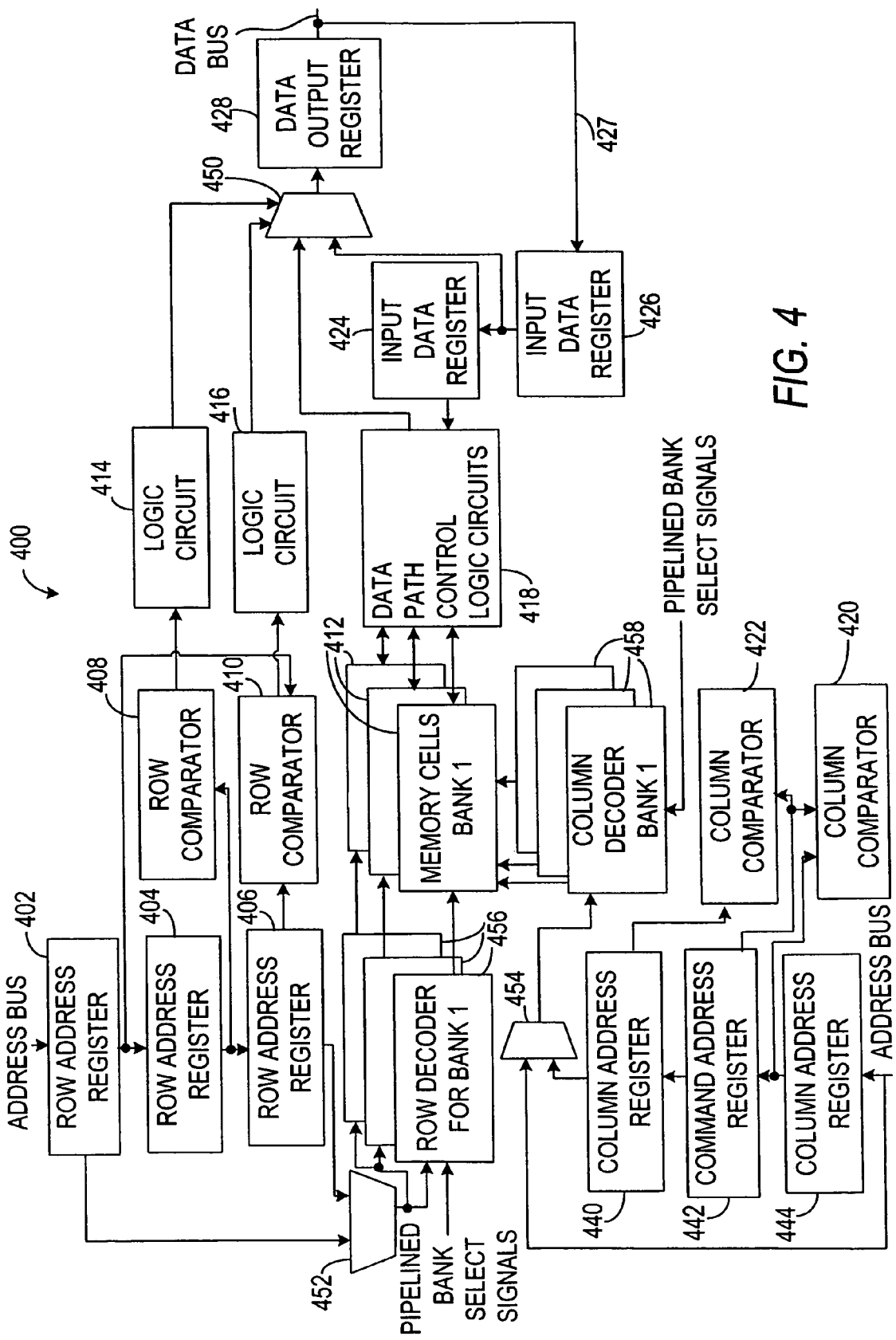
FIG. 4 is a block diagram of a more detailed embodiment of the memory device of FIG. 3 according to the invention.

FIG. 4 illustrates in greater detail various aspects of memory 300 in accordance with the invention. Memory 400 achieves the delayed timing of write data with respect to write addresses, described earlier and shown in timing diagram 200. Memory 400 includes row address register 402, which latches the row address from the address bus. When command decoding circuit 304 detects a first write command on the command bus, command decoding circuit 304 causes the address bus to be latched by row address register 404. Command decoding circuit 304 is coupled to registers 402, 404, and 406 (the connections between command decoding circuit 304 and registers 402, 404, and 406 are not shown for clarity).

When command decoding circuit 304 detects a second write command on the command bus, the contents of row address register 404 are latched by row address register 406. This arrangement of two row address registers 404 and 406 latching the row portion of write addresses results in a pipeline delay of two cycles before the row address initially latched by row address register 402 is presented to row decoder 456, and thus to banks of memory cells 412.

Memory 400 also includes column address registers 440, 442, and 444, which operate similarly to row address registers 402, 404, and 406. Column address registers 442 and 440 are coupled to command decoding circuit 304 and latch the column address when command decoding circuit 304 detects write commands. Command decoding circuit 304 is coupled to registers 402, 404, and 406 (again, the connections are not shown for clarity). Although FIG. 4 shows an embodiment of the invention in which the row and column addresses are delayed by a minimum of two clock cycles, a memory device in accordance with the invention can be alternatively constructed such that row and column addresses are delayed by any number of clock cycles. Additionally, although FIG. 4 shows one set of column and row address registers for delaying row and column addresses, other embodiments of the invention may include one set of column and row registers per bank of memory cells, such that each bank of memory cells operates independently with respect to row and column registers.

As illustrated in FIG. 4, data bus 427 of memory 400 is coupled to input data register 426, which is coupled to input data register 424. Input data registers 424 and 426 are also coupled to command decoding circuit 304 (connections not shown for clarity). The data to be latched into input data registers 424 and 426 are controlled by command decoding circuit 304 such that the contents of input data registers 424 and 426 correspond to the data to be written to the row and column addresses represented by the contents of row address registers 404 and 406, respectively, and column address registers 442 and 440, respectively. In one embodiment of the invention, write data is presented one clock cycle after the write address, as illustrated in FIG. 2. If memory 400 exhibits a one clock cycle delay between write addresses and write data, data from data bus 427 is latched into input data register 426 one clock cycle after the corresponding write address is latched into row address register 402 and column address register 444. In another embodiment of the invention, for example, in a DDR (Double Data Rate) memory device, the delay of data with respect to addresses for write accesses may be greater than the delay of data with respect to read addresses, rather than being equal in magnitude, because DDR memory devices may require extra bus turn-around time.

The delay introduced between write addresses and write data on the address and data busses is removed in accordance with the invention to restore the original relative timing between the write addresses and data for presentation at the interface of the banks of memory cells 412. Referring to FIG. 4, an introduced one clock cycle delay between write addresses and write data can be removed, for example, by latching the write address with three pairs of row and column address registers while the write data is latched by two registers.

Advantageously, memory devices constructed in accordance with the invention are not limited to removal of a one clock cycle delay between write addresses and write data as illustrated in FIGS. 2 and 4. Memory device timing can be modified with other appropriate delays between the timing of write addresses and write data by adjusting the ratio of registers latching the write address to the registers latching the write data or by clocking the registers at only appropriate clock edges such that the desired timing relationship is achieved.

On a write access, the input data is delayed by two clock cycles before being written into memory cells 412. In practice, a new write command will push a previous write access further through the write pipeline. A new write access to the same bank in most DRAM implementations cannot be immediately commanded due to DRAM latency limitations, although other memory technologies may avert these limitations. Note that the invention is not limited by the number of actual physical clock cycles. If a read access follows a write access to the same address and the write access has not yet taken place because the write address and data are in the pipeline (i.e., the write address is contained in registers 404 and 442 or 406 and 444), then the data for that read access is provided by input registers 424 or 426.

In order to check for this condition (i.e., a read access to the same address as a pending write access), adjacent pipelined row and column addresses are compared. In memory 400, row comparator 408 compares the contents of row address register 402 with the contents of row address register 404 when register 402 contains the row address corresponding to a read access. Similarly, row comparator 410 compares the contents of row address register 402 and row address register 406 when register 402 contains the row address corresponding to a read access.

Because addresses of memory locations in memory 400 are referenced by both row and column addresses, the column addresses have to be provided to comparators in the same manner as the row addresses in order to check for the same memory address on two successive memory accesses. Column comparator 420 is provided with the contents of column address registers 444 and 442, and column comparator 422 is provided with the contents of column address registers 444 and 440. The row and column comparators are configured to output a signal that indicates whether the addresses provided to the comparators are the same. For example, if the contents of row address registers 402 and 404 are identical, row comparator 408 outputs a logic-1 signal to indicate that the contents are identical. Similar output signals are provided by comparators 410, 420, and 422. Because the row and column registers have been configured under control of command decoder 304 to correspond to the same access (e.g., row address register 402 and column address register 444 contain the row and column addresses for a specific memory access), logic circuit 414 determines whether both row and column addresses match for comparators 420 and 408 while logic circuit 416 determines whether both row and column addresses match for comparators 422 and 410.

When a read access is to the same memory location as a pending write access, the data for that read access is provided by input data register 424 or 426 instead of from the actual memory cell. For example, if row address register 402 and column address register 444 contain the same address as row address register 404 and column address register 442, input register 426 provides data for the read access. Based on the outputs of logic circuits 414 and 416, one of input registers 426 and 424 provides data to data output register 428. Logic circuits 414 and 416 and registers 426 and 424 are coupled to multiplexer circuit 450 for this purpose.

If a read access does not access the same location as the two pending write accesses, the read access data is provided by memory cells 412. The read access address is latched by row address register 402 and column address register 440 and is selected by multiplexers 452 and 454 for input into row decoders 456 and column decoders 418. Data path control logic circuit 418 controls inbound and outbound data flow to and from memory cells 412. When a read access is provided with data from memory cells 412, circuit 418 drives data from a bank of memory cells. When a write access is providing data to memory cells 412, circuit 418 drives data to all banks of memory cells 412.

Although FIG. 4 illustrates the implementation of posted write accesses in memories such as SDRAMs, posted write accesses can be implemented similarly in other types of row-column access multi-bank memories. For example, DDR DRAMs can use similar circuitry to reduce bus turnaround delay with posted writes. Because data and addresses in DDR DRAMs can be valid on both rising and falling edges of clocks, the circuitry illustrated in FIG. 4 can be modified to be responsive to both rising and falling clock edges. Alternatively, the circuitry illustrated in FIG. 4 can be modified to run at twice the DDR DRAM clock rate.

Figure 5:
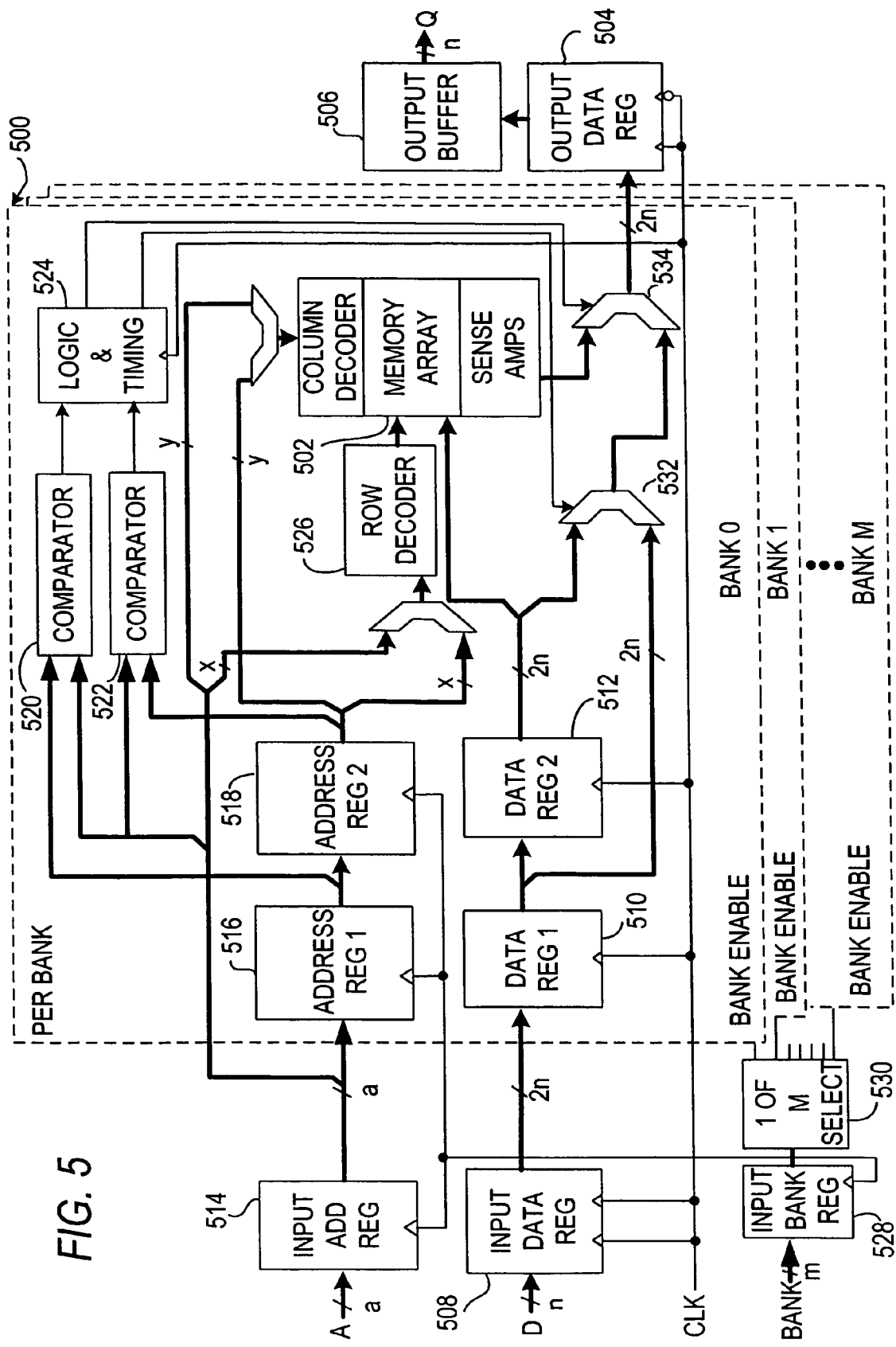
FIG. 5 is a block diagram of another embodiment of a memory device according to the invention.

FIG. 5 illustrates one example of circuitry that can be used for a DDR memory device in accordance with the invention. Circuitry 500 is replicated per bank of memory cells in the memory device. Each bank of memory cells is enabled by bank enable signals that are output from decoder 530, which receives multiplexed bank enable signals from input bank register 528. Registers 514, 516, and 518 latch the input addresses. Registers 508, 510, and 512 latch the input data which is input at double the data rate with both edges of the input clock signal. Comparators 520 and 522 compare the addresses latched in address registers 516 and 518 so as to control whether data to output data register 504 is output by memory array 502 or data registers 510 or 512, so as to provide data for a read access from data registers 510 or 512, if a write access has been performed to the same address within the last two write accesses. Output data register 504 provides data for read accesses to output buffer 506.

Figure 6:
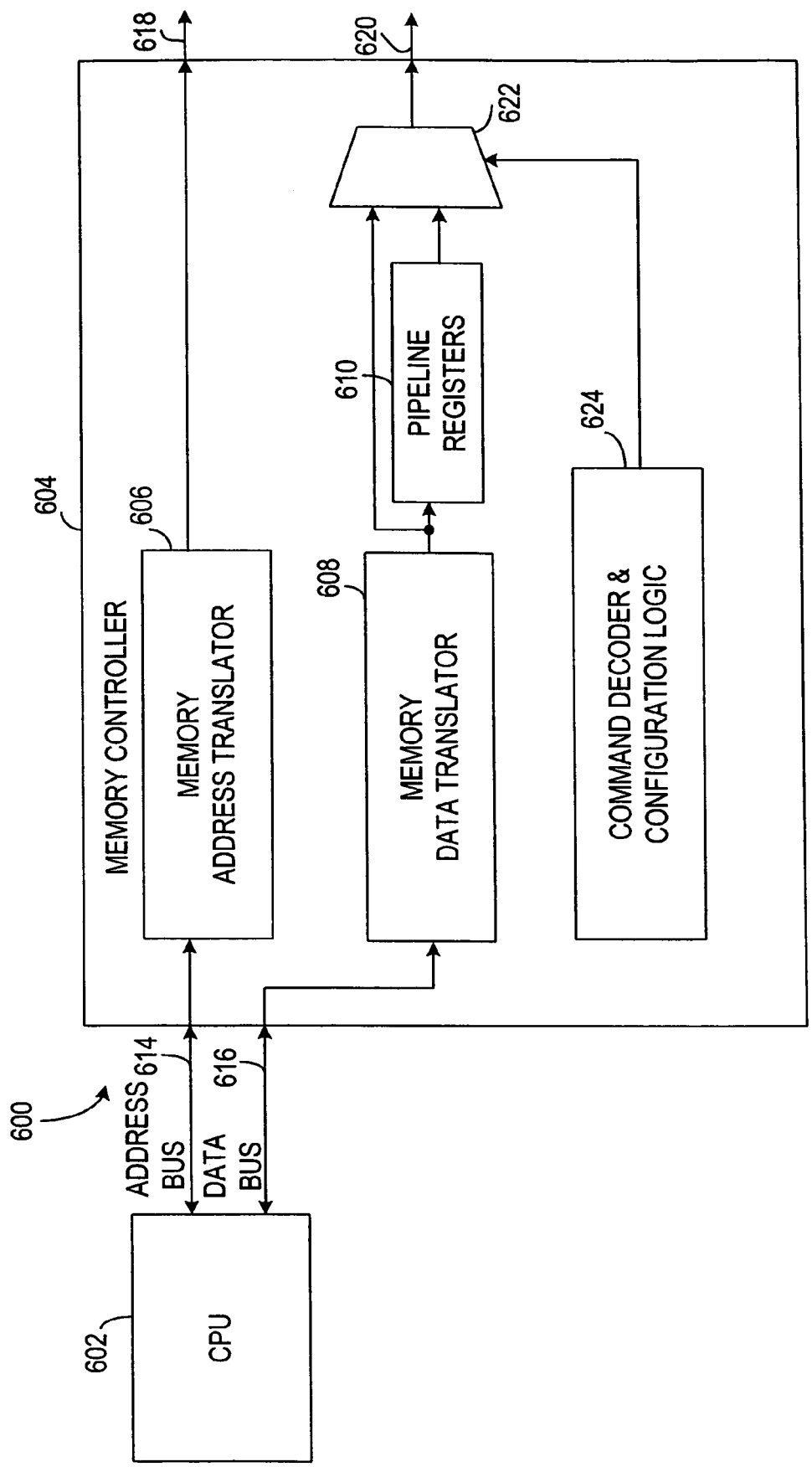
FIG. 6 is a block diagram of a computer circuit according to the invention.

FIG. 6 illustrates computer circuit 600 in accordance with the invention. Computer circuit 600 includes CPU (central processing unit) 602 coupled to memory controller 604 via address bus 614 and data bus 616. (Note that although shown as a separate 30 block, memory controller 604 can be incorporated within CPU 602.) Memory controller 604 is coupled to memory devices (not shown for clarity) via address bus 618 and data bus 620. Memory controller 604 includes memory address translator 606 and memory data translator 608. Translators 606 and 608 modify the formats of addresses and data transmitted by CPU 602 on address bus 614 and data bus 616, respectively, into formats suitable for physical memory devices, if necessary. For example, the addresses transmitted by CPU 602 on address bus 614 may be broken down into row and column portions by translator 606.

The timing of data output from translator 608 is preferably modified by pipeline registers 610 in accordance with timing diagram 200 of FIG. 2. Pipeline registers 610 delay the timing of data relative to addresses for write accesses to a memory device. The number of pipeline registers 610 depends on the desired modification of relative timing between addresses and data for write accesses, and can be increased or decreased to achieve desired results. For example, to introduce a one-cycle delay between a write address and its corresponding data, one set of pipeline registers 610 is needed. Other amounts of delay can also be created, such as, for example, delays that are a multiple of half a clock cycle. The relative timing of addresses and data for read accesses remains the same, and thus no pipeline registers are required to modify read access timing. In one approach, memory controller 604 can be configured during initialization of computer circuit 600 to interface with memory devices on write accesses through programming of its configuration logic circuits. When memory controller 604 has been configured for modified write access timing and command decoder circuits detect a write access, multiplexer 622 selects the output of pipeline register 610 to be transmitted on data bus 620. When command decoder circuits detect a read access, multiplexer 622 selects the output of translator 608 to be output on data bus 620. Addresses and data with modified timing are then output on address bus 618 and data bus 620 to memory devices that process modified timing of addresses and data in accordance with timing diagram 200.

Thus it is seen that read-write access delay and write-read access delay in multi-bank memory devices can be reduced without changing the timing requirements of internal storage circuits by using posted writes. One skilled in the art will appreciate that the invention can be practiced by other than the described embodiments, which are presented for purposes of illustration and not of limitation, and the invention is limited only by the claims which follow.

I claim:

1. A method for performing successive read and write accesses comprising:
   receiving data and an address for a write access;
   adding delay between said address and said data of said write access such that said added delay is about equal to a delay between receipt of an address of a read access and providing of data corresponding to said address of said read access; and
   transmitting said write access with said added delay.

2. The method of claim 1 comprising providing said successive read and write accesses to a multi-bank memory device.

3. The method of claim 1 wherein said adding delay comprises at least one of:
   adding a same number of clock cycles between said address and said data of said write access as the number of clock cycles between said receipt of said address of said read access and said providing data; and
   adding a multiple of half a clock cycle between said address and said data of said write access.

4. The method of claim 1 further comprising removing said added delay.

5. The method of claim 1 further comprising pipelining said addresses and said data of said write access to remove said added delay.

6. A method for performing successive read and write accesses comprising:
   adding delay between an address and data of a write access such that said added delay is about equal to a delay between receipt of an address of a read access and providing of data corresponding to said address of said read access;
   transmitting said write access with said added delay; and
   transmitting said read access successively after said transmitting said write access.

7. A method for performing successive read and write accesses comprising:
   receiving data and an address for a write access;
   adding delay between said address and said data of said write access such that said added delay is about equal to a delay between receipt of an address of a read access and providing of data corresponding to said address of said read access;
   transmitting said read access; and
   transmitting said write access with said added delay successively after said transmitting said read access.

8. A method for performing successive read and write accesses comprising:
   receiving data and an address for a write access;
   adding delay between said address and said data of said write access such that said added delay is about equal to a delay between receipt of an address of a read access and providing of data corresponding to said address of said read access;
   transmitting said write access with said added delay; and
   pipelining said write access address and read access address and said data of said write address to remove said added delay.

9. An Apparatus for performing successive read and write accesses comprising:
   means for receiving data and an address for a write access;
   means for adding delay between said address and said data of said write access such that said added delay is about equal to a delay between receipt of an address of a read access and providing of data corresponding to said address of said read access; and
   means for transmitting said write access with said added delay.

10. An Apparatus for performing successive read and write accesses comprising:
    means for adding delay between an address and data of a write access such that said added delay is about equal to a delay between receipt of an address of a read access and providing of data corresponding to said address of said read access;
    means for transmitting said write access with said added delay; and
    means for removing said added delay at a memory device.

11. A method for performing successive read and write accesses to a multi-bank memory device comprising:
    receiving data and an address for a write access, said address indicating a particular bank of said multi-bank memory device;
    adding delay between said address and said data of said write access such that said added delay is about equal to a delay between receipt of an address of a read access and providing of data corresponding to said address of said read access; and
    transmitting said write access with said added delay.

12. The method of claim 11 wherein said adding delay comprises at least one of:
    adding a same number of clock cycles between said address and said data of said write access as the number of clock cycles between said receipt of said address of said read access and said providing data; and
    adding a multiple of half a clock cycle between said address and said data of said write access.

13. The method of claim 11 further comprising removing said added delay.

14. The method of claim 11 further comprising pipelining said addresses and said data of said write access to remove said added delay.

15. A method for performing successive read and write accesses to a multi-bank memory device comprising:
- adding delay between an address and data of a write access such that said added delay is about equal to a delay between receipt of an address of a read access and providing of data corresponding to said address of said read access, said address indicating a particular bank of said multi-bank memory device;
- transmitting said write access with said added delay; and
- transmitting said read access successively after said transmitting said write access.

16. A method for performing successive read and write accesses to a multi-bank memory device comprising:
- receiving data and an address for a write access, said address indicating a particular bank of said multi-bank memory device;
- adding delay between said address and said data of said write access such that said added delay is about equal to a delay between receipt of an address of a read access and providing of data corresponding to said address of said read access;
- transmitting said read access; and
- transmitting said write access with said added delay successively after said transmitting said read access.

17. A method for performing successive read and write accesses to a multi-bank memory device comprising:
- receiving data and an address for a write access, said address indicating a particular bank of said multi-bank memory device;
- adding delay between said address and said data of said write access such that said added delay is about equal to a delay between receipt of an address of a read access and providing of data corresponding to said address of said read access;
- transmitting said write access with said added delay; and
- pipelining said write access address and read access address and said data of said write address to remove said added delay.

* * * * *